(12) United States Patent
Balcon et al.

(10) Patent No.: US 8,346,184 B2
(45) Date of Patent: Jan. 1, 2013

(54) MULTI-FUNCTIONAL CONTAINER FOR ELECTRIC AND/OR ELECTRONIC APPARATUSES

(75) Inventors: Claudio Balcon, Ponte Nelle Alpi (IT); Mauro Perot, Santa Giustina (IT)

(73) Assignee: Carlo Gavazzi Controls SpA, Milan (IT)

( * ) Notice: Subject to any disclaimer, the term of this patent is extended or adjusted under 35 U.S.C. 154(b) by 448 days.

(21) Appl. No.: 12/682,514

(22) PCT Filed: Oct. 10, 2008

(86) PCT No.: PCT/EP2008/063620
§ 371 (c)(1), (2), (4) Date: Apr. 9, 2010

(87) PCT Pub. No.: WO2009/047329
PCT Pub. Date: Apr. 16, 2009

(65) Prior Publication Data
US 2010/0240326 A1 Sep. 23, 2010

(30) Foreign Application Priority Data
Oct. 12, 2007 (IT) ............................. UD2007A0189

(51) Int. Cl.
*H04B 1/38* (2006.01)
(52) U.S. Cl. .................. 455/90.3; 361/741; 361/814
(58) Field of Classification Search ............ 455/90.2, 455/90.3, 41.1, 41.2; 361/724, 727, 728, 361/741, 814
See application file for complete search history.

(56) References Cited

U.S. PATENT DOCUMENTS

| 5,791,606 | A  | * | 8/1998  | Blackburn ............ 248/27.1 |
| 5,895,016 | A  | * | 4/1999  | Blackburn ............ 248/27.1 |
| 6,510,055 | B1 | * | 1/2003  | Liu et al. ............ 361/724 |
| 6,633,482 | B2 | * | 10/2003 | Rode ............... 361/679.4 |
| 7,865,326 | B2 | * | 1/2011  | Johnson et al. ......... 702/127 |
| 2004/0209525 | A1 |   | 10/2004 | Konrad et al. |
| 2007/0293954 | A1 | * | 12/2007 | Pfingsten et al. ........ 700/22 |
| 2008/0158792 | A1 | * | 7/2008  | Itoh .................. 361/679 |
| 2008/0291643 | A1 | * | 11/2008 | Farago et al. .......... 361/747 |
| 2011/0261549 | A1 | * | 10/2011 | Chao et al. ........... 361/814 |
| 2012/0182698 | A1 | * | 7/2012  | Langels et al. ......... 361/728 |

FOREIGN PATENT DOCUMENTS

| DE | 197 09 554 | 6/1998 |
| EP | 0 145 380  | 6/1985 |
| EP | 0 909 122  | 4/1999 |
| EP | 1 404 170  | 3/2004 |
| FR | 2 789 814  | 8/2000 |

* cited by examiner

*Primary Examiner* — Lewis West
(74) *Attorney, Agent, or Firm* — Hamre, Schumann, Mueller & Larson, P.C.

(57) ABSTRACT

Multi-functional container for electric and/or electronic apparatuses comprising a front face, with a first compartment, to house at least one component (16) of the electric and/or electronic apparatus. The container comprises an opposite rear face having first attachment means (34) suitable to attach the container on guide means of a standardized type (36) in a first installation configuration. The multi-functional container also comprises second attachment means (42), suitable to attach the container in a second installation configuration inserted, at least partly, in a housing seating with the front face disposed toward the inside of the housing seating, and a second compartment, suitable to house the component (16) and disposed on the rear face.

11 Claims, 4 Drawing Sheets

MULTI-FUNCTIONAL CONTAINER FOR ELECTRIC AND/OR ELECTRONIC APPARATUSES

FIELD OF THE INVENTION

The present invention concerns a multi-functional container for an electric and/or electronic apparatus, for example for an instrument to measure electric quantities, or for a radio communication device or a control device, usable in civil and/or industrial applications, such as for example energy meters, electronic automation units or suchlike.

In particular, the container according to the invention is applied for the installation of electric and/or electronic apparatuses in electric panels on a DIN guide or for instruments on the front of the panel, suitable for assembly, for example, on doors of electric panels or machines.

BACKGROUND OF THE INVENTION

Containers are known, for electric and/or electronic apparatuses, suitable for installation on a DIN guide, according to the reference norms IEC 60715 and DIN 43880. These norms define both the sizes of the DIN guide and also the sizes of the containers that can be installed on the DIN guide.

Containers are also known, for electric and/or electronic apparatuses, for front-panel assembly, that is, for the installation on doors of electric panels or machines, according to the reference norm IEC 61554. This norm defines the sizes of the containers for assembly in housing seatings with a hole having a square, rectangular or circular section.

Often the seating available for the installation of the apparatuses is predefined, such as for example in electric panels where assembly on a DIN guide is normally used. One disadvantage therefore is that the choice of an apparatus, for example a measuring instrument with desired function, is limited to the specific instruments and therefore the relative containers, designed for a predetermined installation.

There are accessory adaptation kits available, which allow to assemble, for example on a panel, an apparatus suitable for assembly on a DIN guide. One disadvantage of such accessory kits is that they determine both an increase in cost, due to the additional components which form the kit, and also increased assembly times to assemble the accessory kit on the apparatus.

Purpose of the present invention is to achieve a multi-functional container for electric and/or electronic apparatuses which can be installed, without the aid of specific accessories, both on a DIN guide, according to the DIN 43880 norm, and also on a panel, according to the IEC 61554 norm.

The Applicant has devised, tested and embodied the present invention to overcome the shortcomings of the state of the art and to obtain these and other purposes and advantages.

SUMMARY OF THE INVENTION

The present invention is set forth and characterized in the independent claim, while the dependent claims describe other characteristics of the invention or variants to the main inventive idea.

In accordance with the above purpose, a multi-functional container for an electric and/or electronic apparatus is suitable to be installed in a first configuration on a guide, for example mounted inside an electric panel.

The container comprises two opposite lateral sides, an upper side and an opposite lower side, a front face, comprising a first compartment to house components of the measuring instrument, for example a user interface device, and an opposite rear face. The rear face comprises first attachment means suitable to attach the container in its first installation configuration on the guide.

According to a characteristic feature of the present invention, the container comprises second attachment means suitable to attach it in a second installation configuration, inserted in a predefined housing seating, and a second compartment, disposed on the rear face of the container, associated with said first compartment. In this second configuration the front face of the container is disposed toward the inside of the housing seating and the rear face of the container is disposed, at least partly, outside the seating.

According to another characteristic feature, the first attachment means is suitable to attach the container, in the first installation configuration, on a DIN guide according to the IEC 60715 norm, and the sizes of the container are in conformity with the DIN 43880 norm.

According to another characteristic feature, the second attachment means is suitable to attach the container, in the second installation configuration, in a panel-type housing seating, according to the IEC 61554 norm, and the sizes of the container are in conformity with the IEC 61554 norm.

According to another characteristic feature, the user interface device is able to be mechanically coupled both with the first compartment of the front face, for the installation of the container in the first configuration, and also with the second compartment of the rear face, for the installation of the container in the second configuration. In this way, when the container, and hence the electric and/or electronic apparatus, is installed in a desired configuration, the user interface device is mounted in the compartment of the face that is effectively accessible to the person using the instrument.

According to another characteristic feature, the user interface device comprises first wireless transceiver means, suitable to cooperate with second wireless transceiver means of the electronic card associated with the container, for the exchange of data to be displayed on the user interface device and/or for the transmission of predetermined functioning parameters.

According to another characteristic of the invention, the electric feed of the user interface device is supplied by said first transceiver means, for example by means of interaction through electromagnetic induction with the second transceiver means.

In this way the container and the associated user interface device are coupled mechanically, avoiding the use of electric contacts and allowing to improve the electric insulation between the user interface device and the electric and/or electronic apparatus in the container.

BRIEF DESCRIPTION OF THE DRAWINGS

These and other characteristics of the present invention will become apparent from the following description of a preferential form of embodiment, given as a non-restrictive example with reference to the attached drawings wherein.

DETAILED DESCRIPTION OF A PREFERENTIAL FORM OF EMBODIMENT

Figure 1:
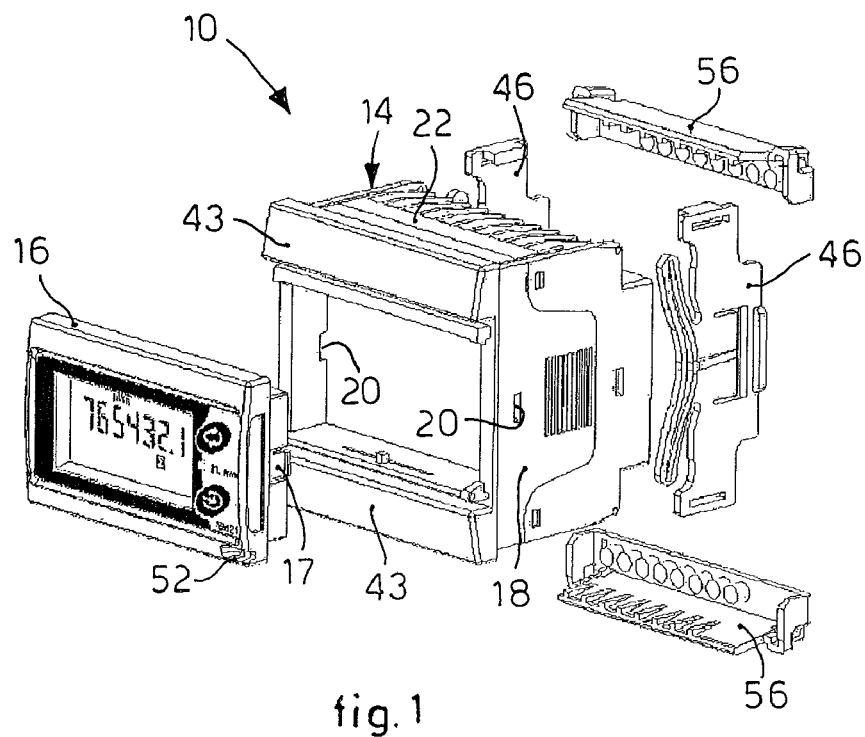
FIG. 1 is an exploded three-dimensional view of a multi-functional container for electric and/or electronic apparatuses according to the present invention.

With reference to the attached drawings, a multi-functional container 14 for electric and/or electronic apparatuses according to the present invention can be installed in electric panels or predefined housing seatings. By electric and/or electronic apparatuses we mean for example a measuring instrument 10 for measuring predetermined and specific quantities, for example electric, or a central unit for the control and/or supervision of automation processes or a radio transceiver apparatus, for example for cell phones or other.

The container 14, substantially parallelepiped in shape, comprises internally an electronic card, of a known type and not shown in the drawings, suitable for example to acquire the measurements of the desired quantities. The instrument 10 also comprises a user interface 16 to display information and/or numerical data relating to the specific quantities measured and for setting and/or modifying functional parameters of the instrument 10.

The container 14 comprises two opposite lateral sides 18, an upper side 22 and an opposite lower side 23, a front face 24 and an opposite rear face 25.

Figure 4:
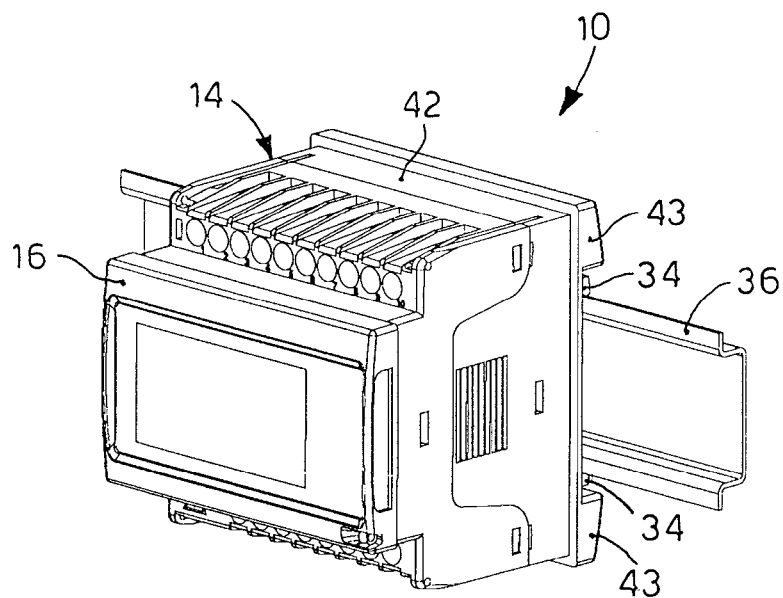
FIG. 4 is a three-dimensional view of the present invention in a first installation configuration.

The front face 24 comprises a first compartment 30, substantially rectangular in shape and mating with the shape of the user interface 16. The first compartment 30 is intended for housing the user interface 16 (FIGS. 1 and 4) and is provided with two lateral grooves 31 able to cooperate with two corresponding attachment tongues 17 disposed laterally on the user interface 16 and provided with a stop tooth for slot-in clamping inside a hole 20 inside the first compartment 30.

Figure 5:
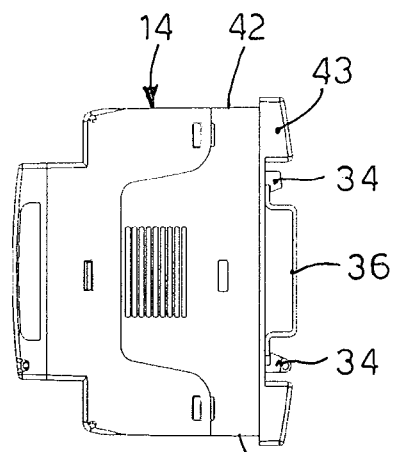
FIG. 5 is a lateral view of FIG. 4.

The container 14 comprises two attachment teeth 34, an upper and a lower (FIGS. 4 and 5) disposed on the rear face 25 of the container and suitable to attach the container 14 in a first installation configuration according to norm DIN 43880 on a guide 36 of the DIN type according to norm IEC 60715. In this case the container 14 of the instrument 10 has an equivalent width, according to said DIN norm, of four modules.

The container 14 also comprises seatings for electric terminals 40, connected electrically to said electronic card, disposed both on the upper side 22 and on the lower side 23, to connect the instrument 10 to the electric network and also to predefined terminal cables for the acquisition of predetermined electric quantities or associated with other quantities (e.g. temperature, physical quantities, contacts, electric inputs and outputs).

Figure 7:
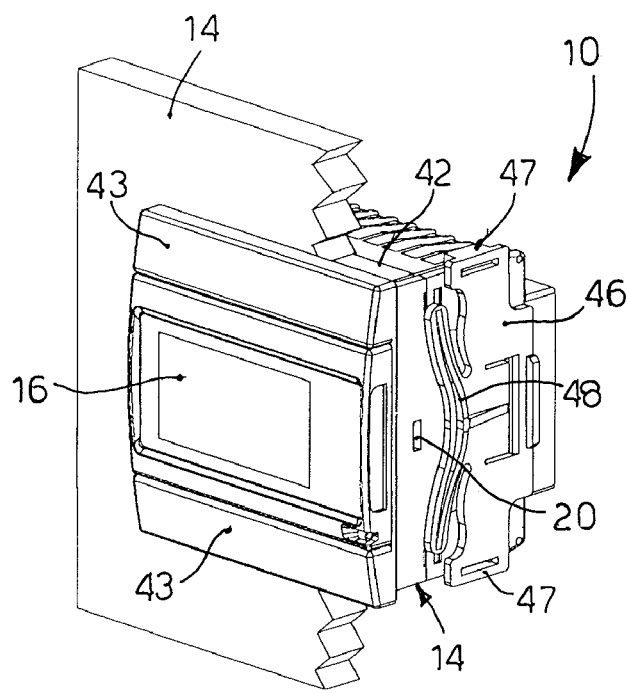
FIG. 7 is a three-dimensional view of the present invention in a second installation configuration.
Figure 8:
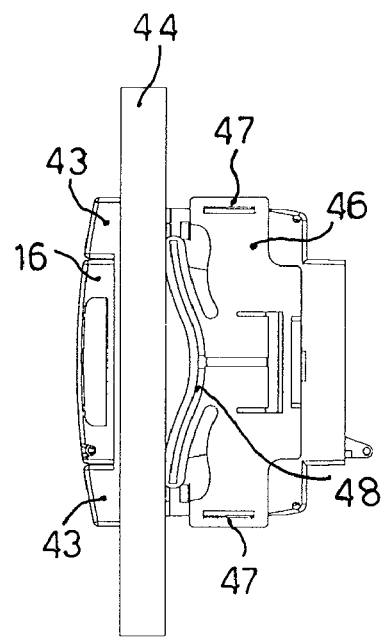
FIG. 8 is a lateral view of FIG. 6.

According to a characteristic feature of the present invention, the container 14 comprises an attachment seating 42, comprising a pair of horizontal frames 43, and disposed perimetrally on the lateral sides 18 and on the upper and lower sides in order to attach the container 14 of the instrument 10 in a second installation configuration. The second installation configuration provides to insert the container 14 in a predefined housing seating, of the panel type according to norm IEC 61554 (FIGS. 7 and 8), in which the front face 24 of the container 14 is disposed toward the inside of the housing seating and the rear face 25 is disposed, at least partly, outside a wall 44 in which the housing seating is made. In this case the container 14 of the instrument 10 can be inserted in a square hole with sides of 72 mm.

The container 14 is also provided with two brackets 46 to clamp the container 14 in its second installation configuration inside the panel type seating. The brackets 46 are mounted on the lateral sides 18 of the container 14, and comprise a substantially plane structure, having at the upper and lower ends a corresponding attachment element 47, to attach the bracket 46 on the container 14. The brackets 46 also comprise a clamping element 48 to clamp the container 14 inside the housing seating in the wall 44. The clamping element 48, made in a single piece with the bracket 46, has a curvilinear and oblong double-appendix shape, co-planar with the structure of the bracket 46.

According to another characteristic feature, the user interface 16 can be removed and positioned in a second compartment 32 disposed on the rear face 25 of the container 14.

In this way, when the instrument 10 is mounted with the container 14 in its second installation configuration, the user interface 16 can also be positioned in the second compartment 32 so that it is always accessible frontally, in relation to the specific installation configuration.

The user interface 16, in order to display data and/or information relating to the physical quantities and in order to set the configuration parameters of the instrument, comprises an LCD type display, or alternatively a LED or OLED type, and a keyboard provided with a predetermined number of keys and/or a joystick.

The user interface 16 also comprises a first transponder device, of a known type and not shown in the drawings. The first transponder device cooperates with an associated second transponder device associated with the electronic card of the instrument 10, for the exchange of data and/or information to be displayed or for the transmission of predetermined functional parameters.

The first transponder device is also suitable to receive from the second transponder device a signal of the electromagnetic induction type for the electric feed of the user interface 16. The user interface 16, mechanically coupled with the container 14 of the instrument 10, is fed by the electronic card inductively, both in the first and also in the second installation configuration.

Figure 9:
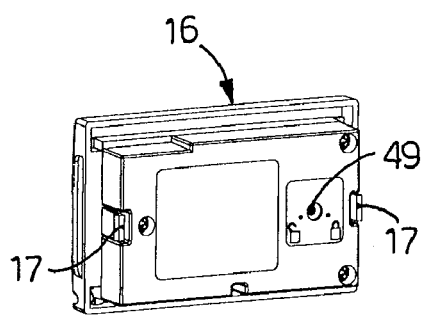
FIG. 9 is a rear three-dimensional view of a third detail.

The user interface 16 also comprises (FIG. 9) a linear or rotary switch, or a trimmer 49, drivable with a precision screwdriver for example, and able to prevent the modification of the configuration parameters when regulated in a specific position. The trimmer 49 is disposed at the rear of the user interface 16, normally facing toward the inside of the first compartment 30 or the second compartment 32.

Figure 2:
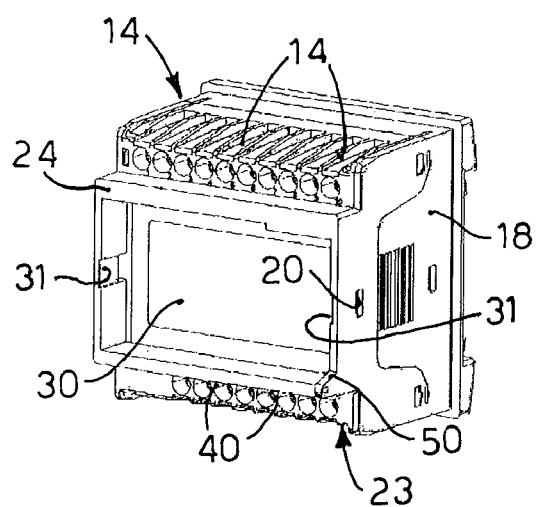
FIG. 2 is a three-dimensional view of a detail of FIG. 1.
Figure 3:
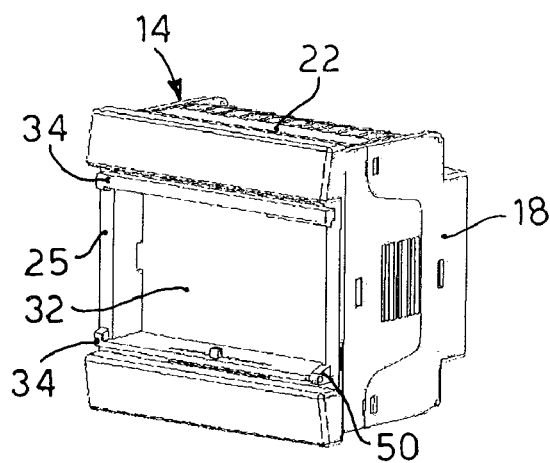
FIG. 3 is a three-dimensional view of a second detail of FIG. 1.
Figure 10:
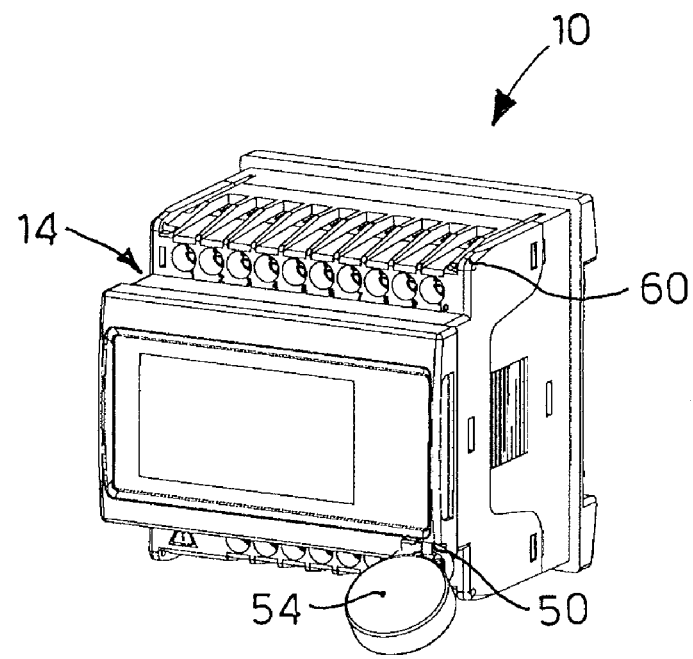
FIG. 10 is a three-dimensional view of a variant of the present invention.

The container 14 also comprises (FIGS. 2, 3 and 10) a holed tooth 50 on the front face 24, and on the rear face 25 the lower tooth 34 is provided with a hole. The teeth 34 and 50 are able to be inserted in a hole 52 disposed on the lower right edge of the user interface 16 when the user interface 16 is disposed in the first compartment 30 or the second compartment 32, in order to seal the user interface 16 with a lead seal 54.

The seal prevents the removal of the user interface 16, mechanically coupled with the first compartment 30 or the second compartment 32, according to the specific installation configuration, and together with the regulation of the trimmer 49 in the clamping position of the functioning parameters, allows to use the instrument 10, for example an energy measuring instrument, for applications of a fiscal nature.

Figure 11:
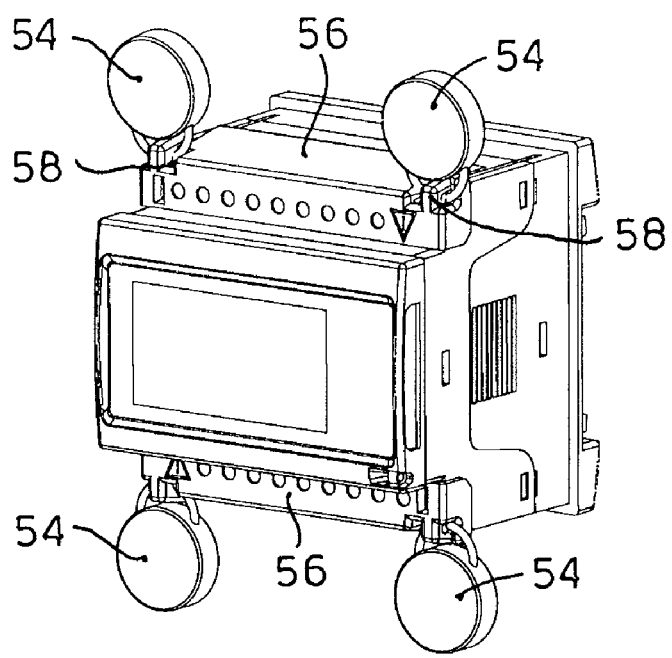
FIG. 11 is a three-dimensional view of a second variant of the present invention.

The container 14 also comprises two covers 56 to seal the terminals 40 (FIGS. 1 and 11) able to prevent access to the connection terminals 56, so as to allow maintenance of the instrument 10 only to authorized personnel.

The container 14 as described heretofore is assembled as follows.

Figure 6:
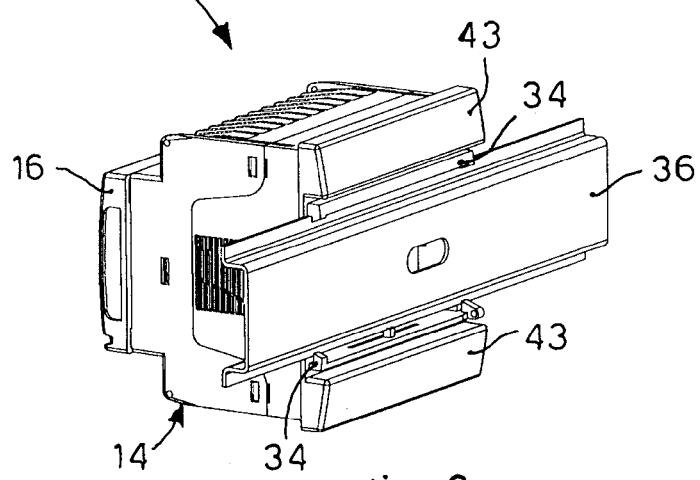
FIG. 6 is a rear three-dimensional view of the present invention in the first installation configuration.

To assemble the container 14 in the first installation configuration, on a DIN guide (FIGS. 4, 5 and 6), it is positioned so as to engage the teeth 34 on the shaped profile of a DIN bar. The user interface 16 is inserted into the first compartment 30 of the container 14 before or after installation of the container 14, making the tongues 17 engage in the grooves 31 until a stop tooth of the tongue 17 is inserted into the hole 20.

The user interface 16 can also be removed from the first compartment 30 without the aid of any tool. In this way the user interface 16 can be positioned on the container 14 of the instrument 10 only for the time needed to set the configurations necessary for the functioning of the instrument 10, and then can possibly be removed.

To assemble the container 14 in the second panel-type installation configuration (FIGS. 7 and 8), according to norm IEC 61554, the brackets 46 are attached on the lateral sides, by slotting in the attachment elements 47 onto the upper side 22 and the lower side 23. The container 14 is inserted in the holed seating of the wall 44 until the attachment seating 42 engages with the edge of the holed seating, until the frames 43 stop through abutment with the wall 44. The clamping elements 48 of the brackets 46 clamp the container 14, from inside the wall 44, and clamp it in this position.

The user interface 16 is inserted into the second compartment 32 of the container 14 before or after the installation of the instrument 10, making the tongues 17 engage until the relative stop tooth is inserted into the holes 20.

The user interface 16 can also be removed from the first compartment 30 by inserting the tip of a tool, for example a screwdriver, into the holes 20 on the lateral sides 18 so as to detach the stop teeth of the tongues 17, and only after having removed the container 14 from the panel seating in the wall 44. In this way, in this second installation configuration, the user interface 16 is deliberately not removable.

It is clear that modifications and/or additions of parts may be made to the container 14 as described heretofore, without departing from the field and scope of the present invention.

It is also clear that, although the present invention has been described with reference to some specific examples, a person of skill in the art shall certainly be able to achieve many other equivalent forms of multi-functional container for electric and/or electronic apparatuses, having the characteristics as set forth in the claims and hence all coming within the field of protection defined thereby.

The invention claimed is:

1. A multi-functional container for electric and/or electronic apparatuses comprising a front face having a first compartment shaped so as to house at least a user interface and an opposite rear face, having first attachment means able to attach the container on a rail in a first installation configuration with said user interface attached to said front face to be accessible frontally by a user, the container also comprising second attachment means disposed perimetrally on lateral sides of the container, for attaching the container in a second installation configuration turned by 180° with respect to the first installation configuration and at least partly inserted in a panel type housing seating wherein said front face is disposed toward the inside of said housing seating and said rear face is disposed outside said housing seating, and the container further comprising a second compartment, on said rear face shaped so as to house said user interface when the container is attached in the second installation configuration thereof with said user interface attached to said rear face to be accessible frontally by a user.

2. The container as in claim 1, wherein said rail is a DIN guide according to norm IEC 60715.

3. The container as in claim 1, wherein said panel type housing seating comprises a square hole with sides of a length around 72 mm.

4. The container as in claim 1, wherein said user interface comprises first wireless transceiver means able to cooperate with second wireless transceiver means comprised in said electric and/or electronic apparatus.

5. The container as in claim 4, wherein said first transceiver means and said second transceiver means are a transponder.

6. The container as in claim 4, wherein said second transceiver means is able to feed said user interface by means of electromagnetic induction.

7. The container as in claim 1, wherein said user interface comprises a linear or rotary switch, disposed at the rear, and adjustable in at least two positions, in which a first position is able to allow the modification of functioning parameters of said apparatus and a second position is able to prevent the modification of said functioning parameters of said apparatus.

8. The container as in claim 1, comprising, both in said front face and also in said rear face, third attachment means able to cooperate with a hole of said user interface for the anti-removal sealing of the user interface inserted both in said first compartment, in said first installation configuration, and also in said second compartment, in said second installation configuration.

9. The container as in claim 1, comprising electric terminals able to connect said apparatus to an electric feed network and to connect to terminals for the acquisition of desired electric or physical quantities and/or electric outputs.

10. The container as in claim 9, comprising cover elements able to prevent tampering with said electric terminals.

11. The container as in claim 10, wherein said cover elements comprise fourth attachment means able to cooperate with second holes disposed on the container for the anti-removal sealing of said cover elements.

* * * * *